(12) United States Patent
Champion et al.

(10) Patent No.: US 7,639,486 B2
(45) Date of Patent: Dec. 29, 2009

(54) RACK SYSTEM PROVIDING FLEXIBLE CONFIGURATION OF COMPUTER SYSTEMS WITH FRONT ACCESS

(75) Inventors: David Frederick Champion, Durham, NC (US); Karl Klaus Dittus, Durham, NC (US); Brian Gormley, Chaple Hill, NC (US); Vinod Kamath, Raleigh, NC (US); Michael Sven Miller, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 11/955,865

(22) Filed: Dec. 13, 2007

(65) Prior Publication Data

US 2009/0152216 A1 Jun. 18, 2009

(51) Int. Cl.
*H05K 7/20* (2006.01)
(52) U.S. Cl. ............. 361/679.32; 361/725; 361/727; 713/300; 713/320; 713/322; 211/26
(58) Field of Classification Search ......... 361/679.31, 361/679.33, 679.41, 679.47, 679.55, 687, 361/690–697, 724–728; 713/224, 300, 320, 713/322; 454/184; 62/414–419, 186, 259.2; 165/903, 104.33, 104.34, 104.19, 121–126, 165/80.5; 29/592.1, 729, 830, 832, 854; 312/223.2, 223.3
See application file for complete search history.

(56) References Cited

U.S. PATENT DOCUMENTS

| | | | | |
|---|---|---|---|---|
| 5,119,270 A | * | 6/1992 | Bolton et al. | 361/679.33 |
| 5,761,033 A | * | 6/1998 | Wilhelm | 361/679.33 |
| 5,868,261 A | * | 2/1999 | Collins et al. | 211/26 |
| 6,052,278 A | * | 4/2000 | Tanzer et al. | 361/679.33 |
| 6,272,573 B1 | * | 8/2001 | Coale et al. | 710/100 |

(Continued)

FOREIGN PATENT DOCUMENTS

WO WO03103359 A1 12/2003

OTHER PUBLICATIONS

PCT/EP/2008/067401 "International Search Report and Written Opinion", Dated Apr. 2, 2009, 16 pages.

*Primary Examiner*—Michael V Datskovskiy
(74) *Attorney, Agent, or Firm*—Cynthia G. Seal; Jeffrey L. Streets

(57) ABSTRACT

A system for receiving and supporting a plurality of devices connected to a network. The system comprises a rack having a front side providing access to a plurality of chassis bays for receiving a chassis and aligning a back end of the chassis for blind docking with an electrical power source. The chassis includes a power supply, a fan, and a front side providing access to a plurality of module bays for receiving a module and aligning a back end of the module for blind docking with the power supply. A compute module is received in a module bay and directly blind docked to the power supply. The system further includes at least one other module received in a module bay within the same chassis as the compute module and directly blind docked with the same power supply along with the compute module. The at least one other module is interchangeably selected from the group consisting of a second compute module and an expansion module, wherein the one or more components of the expansion module are controlled by the motherboard of the compute module within the same chassis.

20 Claims, 7 Drawing Sheets

U.S. PATENT DOCUMENTS

| | | | |
|---|---|---|---|
| 6,374,627 B1 | 4/2002 | Schumacher et al. | |
| 6,392,892 B1 * | 5/2002 | Sobolewski et al. | 361/724 |
| 6,494,252 B1 | 12/2002 | Takala et al. | |
| 6,496,366 B1 | 12/2002 | Coglitore et al. | |
| 6,594,150 B2 | 7/2003 | Creason et al. | |
| 6,600,703 B1 * | 7/2003 | Emberty et al. | 369/30.83 |
| 6,621,713 B2 * | 9/2003 | Amaike et al. | 361/797 |
| 6,628,513 B1 * | 9/2003 | Gallagher et al. | 361/679.33 |
| 6,654,252 B2 * | 11/2003 | Raynham | 361/727 |
| 6,775,137 B2 * | 8/2004 | Chu et al. | 361/696 |
| 6,778,381 B1 * | 8/2004 | Bolognia et al. | 361/679.07 |
| 6,819,563 B1 | 11/2004 | Chu et al. | |
| 6,856,508 B2 * | 2/2005 | Rabinovitz | 361/679.31 |
| 6,867,967 B2 | 3/2005 | Mok | |
| 6,906,914 B2 * | 6/2005 | Stamos et al. | 361/679.31 |
| 6,934,150 B2 | 8/2005 | Kitchen et al. | |
| 6,945,058 B2 | 9/2005 | Bash et al. | |
| 6,948,021 B2 * | 9/2005 | Derrico et al. | 710/302 |
| 6,957,291 B2 * | 10/2005 | Moon et al. | 710/302 |
| 6,967,842 B2 | 11/2005 | Aoki et al. | |
| 7,027,298 B2 * | 4/2006 | Wu et al. | 361/679.37 |
| 7,031,153 B2 * | 4/2006 | Tanaka et al. | 361/679.48 |
| 7,051,802 B2 * | 5/2006 | Baer | 165/299 |
| 7,054,163 B2 * | 5/2006 | Coffey | 361/796 |
| 7,058,826 B2 * | 6/2006 | Fung | 713/300 |
| 7,120,016 B2 * | 10/2006 | Suzuki et al. | 361/679.33 |
| 7,134,011 B2 * | 11/2006 | Fung | 713/100 |
| 7,138,733 B2 * | 11/2006 | Sanders et al. | 307/147 |
| 7,185,124 B2 * | 2/2007 | Matsushige et al. | 710/36 |
| 7,200,008 B1 * | 4/2007 | Bhugra | 361/724 |
| 7,236,370 B2 * | 6/2007 | Coglitore et al. | 361/724 |
| 7,295,442 B2 * | 11/2007 | Garnett et al. | 361/728 |
| 7,327,563 B2 * | 2/2008 | Cauthron | 361/679.55 |
| 7,394,660 B2 * | 7/2008 | Hidaka | 361/727 |
| 7,423,870 B2 * | 9/2008 | Carlisi et al. | 361/679.41 |
| 7,460,375 B2 * | 12/2008 | Randall et al. | 361/724 |
| 7,487,283 B2 * | 2/2009 | Sivertsen | 710/306 |
| 2002/0124114 A1 | 9/2002 | Bottom et al. | |
| 2003/0048614 A1 | 3/2003 | Garnett et al. | |
| 2005/0225936 A1 | 10/2005 | Day | |
| 2005/0247433 A1 | 11/2005 | Corrado et al. | |
| 2005/0265004 A1 | 12/2005 | Coglitore et al. | |
| 2007/0002536 A1 | 1/2007 | Hall et al. | |
| 2007/0032979 A1 | 2/2007 | Hamann et al. | |

* cited by examiner

RACK SYSTEM PROVIDING FLEXIBLE CONFIGURATION OF COMPUTER SYSTEMS WITH FRONT ACCESS

BACKGROUND OF THE INVENTION

1. Field of the Invention

The present invention relates to the configuration of computer systems into a rack for efficient use of space in a data center.

2. Description of the Related Art

A data center is a facility used to house computer systems and associated components, such as telecommunications and storage systems. It generally includes redundant or backup power supplies, redundant data communications connections, environmental controls (air conditioning, fire suppression, etc.), and special security devices. Datacenters concentrate large amounts of processing systems within a small area in order to provide an efficient and optimal environment to operate the systems. Power, cooling and other management services can be provided more efficiently in a datacenter than if the systems are decentralized.

Continuing demands for increasing processing system capacity require that the data center must be designed for efficient power management, thermal management, configurational flexibility, and maintenance. These competing design considerations have led to the development of numerous systems, but the most common of these systems include the use of racks that support large numbers of components and are arranged side by side in rows. In a typical data center, cold aisles supply chilled air to the front sides of two adjacent rows of racks and hot aisles exhaust warmed air from the back sides of two adjacent rows of racks. Alternating hot and cold aisles enable relatively efficient air flow management and cooling, while providing access aisles along the front and back of each row of racks to facilitate installation, reconfiguration and maintenance.

However, there remains a need for even more efficient rack systems that make more efficient use of the space in a given data center while still providing thermal management and configurational flexibility. It would be desirable to have a more efficient rack system that utilized many standardized components, such as motherboards, hard disk drives, and PCI cards. It would be even more desirable if the rack system increased the density of the processing system without overloading existing cooling systems and without complicating the configuration and reconfiguration of the components.

SUMMARY OF THE INVENTION

One embodiment of the invention provides a system for receiving and supporting a plurality of devices connected to a network. The system comprises a rack having a front side providing access to a plurality of chassis bays, each chassis bay being adapted to receive a chassis and align a back end of the chassis for blind docking with an electrical power source. A chassis is received in a chassis bay and blind docked to an electrical power source. The chassis includes a power supply, a fan, and a front side providing access to a plurality of module bays, wherein each module bay is configured to receive a module and align a back end of the module for blind docking with the power supply. A compute module is received in a module bay and directly blind docked to the power supply. The compute module includes a motherboard in communication with an input/output panel on a front side of the module. The system further includes at least one other module received in a module bay within the same chassis as the compute module and directly blind docked with the same power supply along with the compute module. The at least one other module is interchangeably selected from the group consisting of a second compute module and an expansion module, wherein the expansion module includes one or more components selected from the group consisting of a hard disk drive, PCI card, or combinations thereof, and wherein the one or more components of the expansion module are controlled by the motherboard of the compute module within the same chassis. Optionally, the rack forms two columns of chassis bays.

In various embodiments, the chassis may include different number of module bays, but chassis preferably includes two or three module bays. In a specific embodiment, the system includes a plurality of chassis, wherein each chassis is received in a chassis bay of the rack, and wherein the plurality of chassis includes at least one chassis with two module bays and at least one chassis with three module bays.

In yet another embodiment, the system further comprises a plurality of chassis, each chassis received in a chassis bay of the rack, wherein the plurality of chassis includes at least one chassis including two compute modules and at least one chassis including a compute module and an expansion module. Optionally, the compute module may include a hard disk drive.

An additional embodiment of the system further comprises a plurality of chassis, wherein each chassis including at least one compute module, and a network switch disposed in the rack, wherein the network switch has an input/output panel accessible from the front of the rack. Each compute module communicates with the network switch via a cable having both ends fully accessible from the front of the rack without disturbing the position of any other component of the system. Optionally, the network switch extends perpendicular to each compute module and is disposed along the side of each compute module. In a further option, each cable may extend between the input/output panel of a compute module and the input/output panel of the switch without blocking the front of adjacent compute modules.

In a further embodiment, the rack has a back side opposite the front side, wherein the back side provides an air opening that optionally may be covered by a heat exchanger. For example, the heat exchanger may block access to the plurality of servers from the back side of the rack. Preferably, the fans direct air flow into the front side of the rack and out the back side of the rack through the heat exchanger. The heat exchanger preferably includes tubes for circulating chilled water, such as in a fin tube heat exchanger.

Other embodiments, aspects, and advantages of the invention will be apparent from the following description and the appended claims.

DETAILED DESCRIPTION OF PREFERRED EMBODIMENTS

Figure 1:
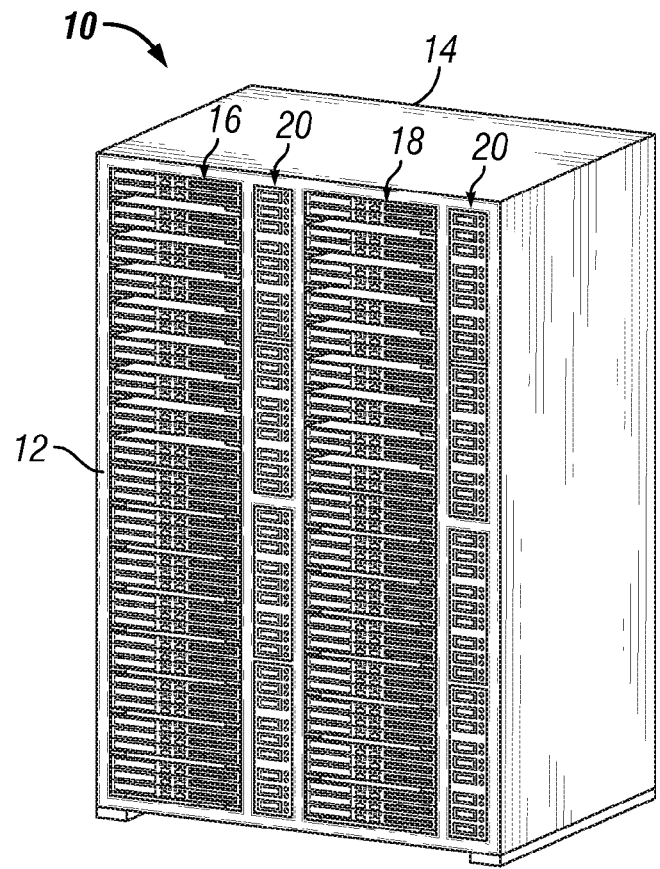
FIG. 1 is a perspective front view of a rack according to one embodiment of the invention.

One embodiment of the present invention provides a system for receiving and supporting a plurality of devices connected to a network. These devices are sometimes referred to as "nodes." The system comprises a rack including a plurality of chassis bays and has a front side providing access to the plurality of chassis bays. Each chassis bay is adapted to receive a chassis and align a back end of the chassis for blind docking with an electrical power source. The chassis includes a power supply and a fan, and has a front side providing access to a plurality of module bays, wherein each module bay is configured to receive a module and align a back end of the module for blind docking with the power supply. A compute module is received in a module bay and directly blind docked to the power supply. The compute module includes a motherboard in communication with an input/output panel on a front side of the module. The system further includes at least one other module received in a module bay within the same chassis as the compute module and directly blind docked with the same power supply along with the compute module. Then at least one other module is interchangeably selected from the group consisting of a second compute module and an expansion module, wherein the expansion module includes one or more components selected from the group consisting of a hard disk drive, PCI card, or combinations thereof, and wherein the one or more components of the expansion module are controlled by the motherboard of the compute module within the same chassis.

In a further embodiment of the system, the rack forms two columns of chassis bays. A front side of the rack provides access to both columns of chassis bays. The inclusion of two columns of chassis bays in a common rack creates a rack having a greater width along the front side and back side than a conventional rack having only one column.

In yet another embodiment, a rack having a plurality of columns also has a back side opposite the front side, wherein the back side provides an air opening that may be covered by a heat exchanger. The greater width of the back side allows for a larger, more robust heat exchanger than can be employed on a conventional rack having only one column. In a preferred embodiment, the heat exchanger covers the air opening and effectively blocks access to the plurality of servers from the back side of the rack. A suitable heat exchanger, for example, includes tubes for circulating chilled water. A preferred type of heat exchanger is a fin tube heat exchanger.

The fans preferably direct air flow into the front side of the rack and out the back side of the rack through the heat exchanger, although the fans may provide a rack with a reverse air flow direction. Furthermore, the fans may be oriented to move air from the front side to the back side or from the back side to the front side, and different racks may have different fan orientations. Although there is a separate set of fans in each chassis whose airflow direction can be independently oriented, it is preferable that each set of fans within a rack are oriented in the same direction.

A chassis may include any number of module bays, but the chassis preferably has two, three or four module bays. Optionally, the rack may receive a plurality of chassis with a different number of module bays, such as a rack receiving at least one chassis with two module bays (a 2U chassis) and at least one chassis with three module bays (a 3U chassis). The size of the chassis bays may be selectively configurable to receive any of the available chassis, such as by adjusting the elevation of a horizontal rail secured to a pair of vertical supports on either side of the chassis bays. The horizontal rails preferably run from front to back and provide support and alignment of the chassis into the rack.

In a further embodiment, the size of the chassis is selected on the basis of the number and type of modules that will be installed within the chassis. For example, a 2U chassis may include either two compute modules or one compute module and one expansion module. However, it is preferable that any chassis include at least one compute module and that the components in any expansion module will interface directly with a compute module within the same chassis, such as through an interface to a system bus or peripheral bus. These interconnections between modules are preferably made prior to installing the modules into a chassis. Each compute module should have an input/output panel on the front side of the module, wherein the input/output panel includes at least one input/output port for receiving a network cable.

In a further embodiment, the system further comprises a network switch disposed in the rack and having an input/output panel accessible from the front of the rack. Accordingly, each compute module communicates with the a network switch via a cable having both ends fully accessible from the front of the rack without disturbing the position of any other component of the system. Optionally, the network switch extends perpendicular to each compute module and is disposed along the side of each compute module. This optional placement of the network switch allows each cable to extend between the input/output panel of a compute module and the input/output panel of the switch without blocking the front of adjacent compute modules or expansion modules. In a preferred arrangement, the compute modules are substantially horizontal and the network switches are positioned substantially vertical along either side of each column of chassis/modules in the rack.

FIG. 1 is a perspective front view of a rack according to one embodiment of the invention. The rack 10 has a front side 12 and a back side 14 (See also FIG. 2). The front side 12 of the rack 10 provides access to chassis bays for receiving chassis, which chassis provide front access to a plurality of module bays for receiving modules. The chassis and modules are arranged horizontally in two vertical columns 16, 18 and network switches 20 are arranged vertically adjacent each column 16, 18.

Figure 2:
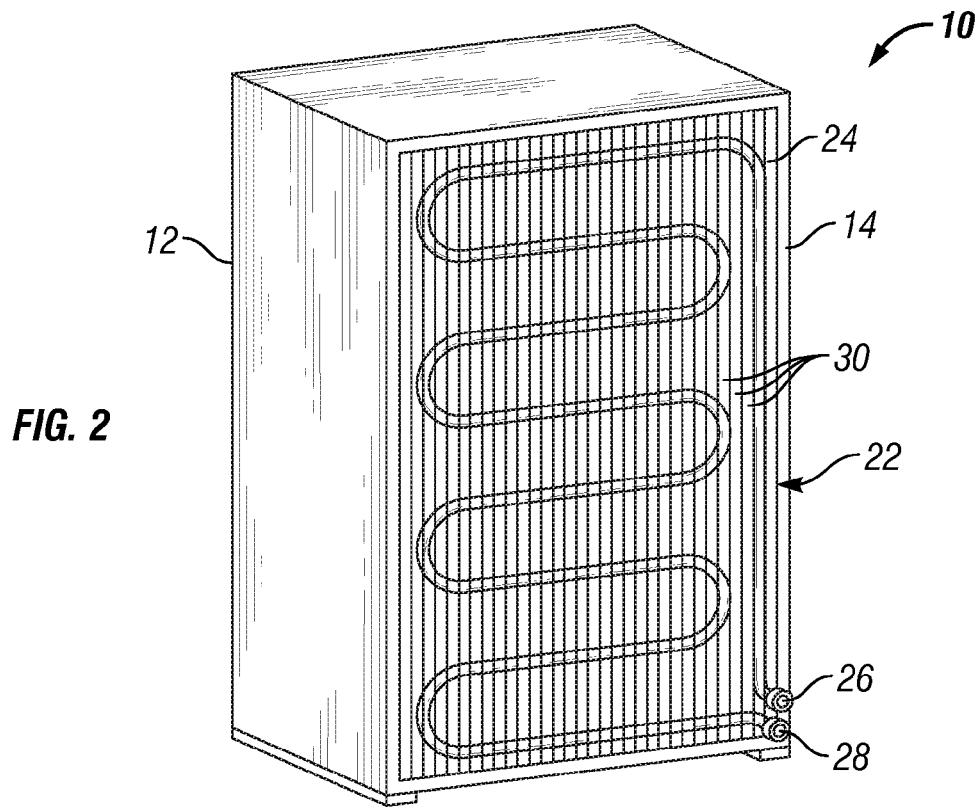
FIG. 2 is a perspective back view of a rack according to one embodiment of the invention.

FIG. 2 is a perspective back view of the rack 10, according to one embodiment of the invention, having a fin tube heat exchanger 22 extending across the back side 14 of the rack. Because the rack 10 houses two columns 16, 18 of chassis and modules (See FIG. 1), the heat exchanger 22 is larger and more robust than a similar heat exchanger in a conventional single column rack. One or more tubes 24 circulate chilled water, or other coolant fluid such as a refrigerant or evaporative refrigerant, from a coolant inlet 26 to a coolant outlet 28 under the force of an external pump (not shown). Although the heat exchanger 10 is shown with a single tube traversing a serpentine path, various tube arrangements are equally possible. For example, the tubes may include manifolds or plenums with multiple parallel tube branches or multiple tubes having their own inlets and outlets. The tubes are in direct thermal communication and contact with a plurality of fins 30 that collectively provide a large surface area for contacting air flowing between the fins. Typically, air will flow into the front side 12 of the rack 10 (See FIG. 1) and flow out of the back side 14 of the rack 10. The heat exchanger 22 may be fixed to rack 10 or hingedly mounted along one edge. However, in accordance with the invention, the heat exchanger may be fixed to the rack and effectively block access to the contents of the rack during normal operation.

Air flowing into a rack is typically cooled below room ambient temperature by an air conditioning system, however the air temperature rises as heat is transferred from electronic devices within the rack to the air flowing through the rack. As a result, air exiting a rack without a heat exchanger will typically have a temperature that is above room ambient temperature. However, the outlet heat exchanger transfers some portion of the heat from the exhaust air to the cooling fluid. Optionally, the heat exchanger exhausts air back into the room at temperatures at or near room ambient temperature. The heat exchanger, therefore, significantly reduces the thermal load on the room air conditioning system and allows more equipment to be supported without increasing the capacity of the air conditioning system. Furthermore, the heat exchanger allows the racks to be arranged differently in the data center, such as direct back-to-back arrangements or reduced "hot" aisle spacing.

Figure 3:
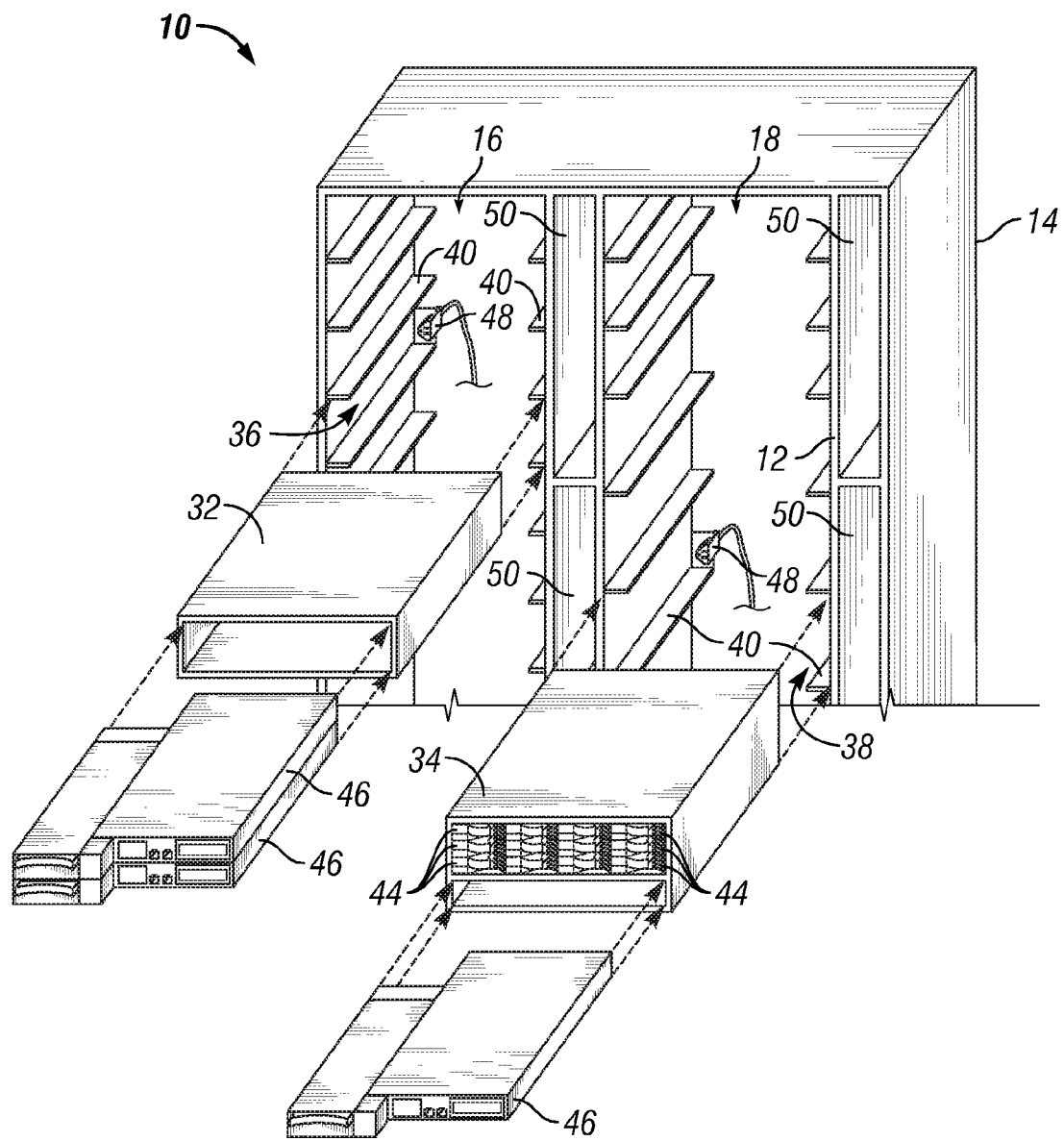
FIG. 3 is a schematic partial assembly view of a rack receiving a pair of chassis, wherein each chassis is receiving a computer subassembly.

FIG. 3 is a schematic partial assembly view of the rack 10 receiving a first chassis 32 into a chassis bay 36 in the left hand column 16 of the rack 10 and a second chassis 34 into a chassis bay 38 in the right hand column 18 of the rack 10. The two chassis 32, 34 are received and supported on horizontal rails 40 that are spaced at a first distance to accommodate the 2U chassis 32 and a second distance to accommodate the 3U chassis 34. The vertical spacing between rails 40 is preferably adjustable to accommodate any combination of chassis having the same or different size.

Furthermore, a first 2U chassis 32 is receiving two 1U compute modules 46 and a second 3U chassis 34 is receiving a compute module 46 and has already received twelve 3.5 inch disk drives 44 that are installed into the drive bays that are a permanent part of the chassis 34. The 2U chassis 32 receives the two compute modules 46 independent of the other.

To the right of each column 16, 18 there are a plurality of network switch bays 50 that are suitable to receive a plurality of network switches (not shown). Having the network switch bays 50 located along the edge of the chassis bays 36, 38 facilitates network cable connections between compute modules and a network switch that are short, avoid interfering with access to adjacent modules, and allow the connections to be made from the front side 12 of the rack.

Furthermore, the lower left side rail 40 of each chassis bay 36, 38 secures an AC power cord connector 48 arranged in order to blind dock with a chassis power supply. More detail regarding the positioning of the power supplies within the chassis may be found in association with FIGS. 4 and 8. As shown, the cord connector 48 is aligned with a mating connector on the power supply so that complete insertion of the chassis 32, 34 into the respective chassis bay 36, 38 completes the connection and supplies power to the respective power supply. No access from the back of the rack 10 is necessary to complete this connection.

Figure 4:
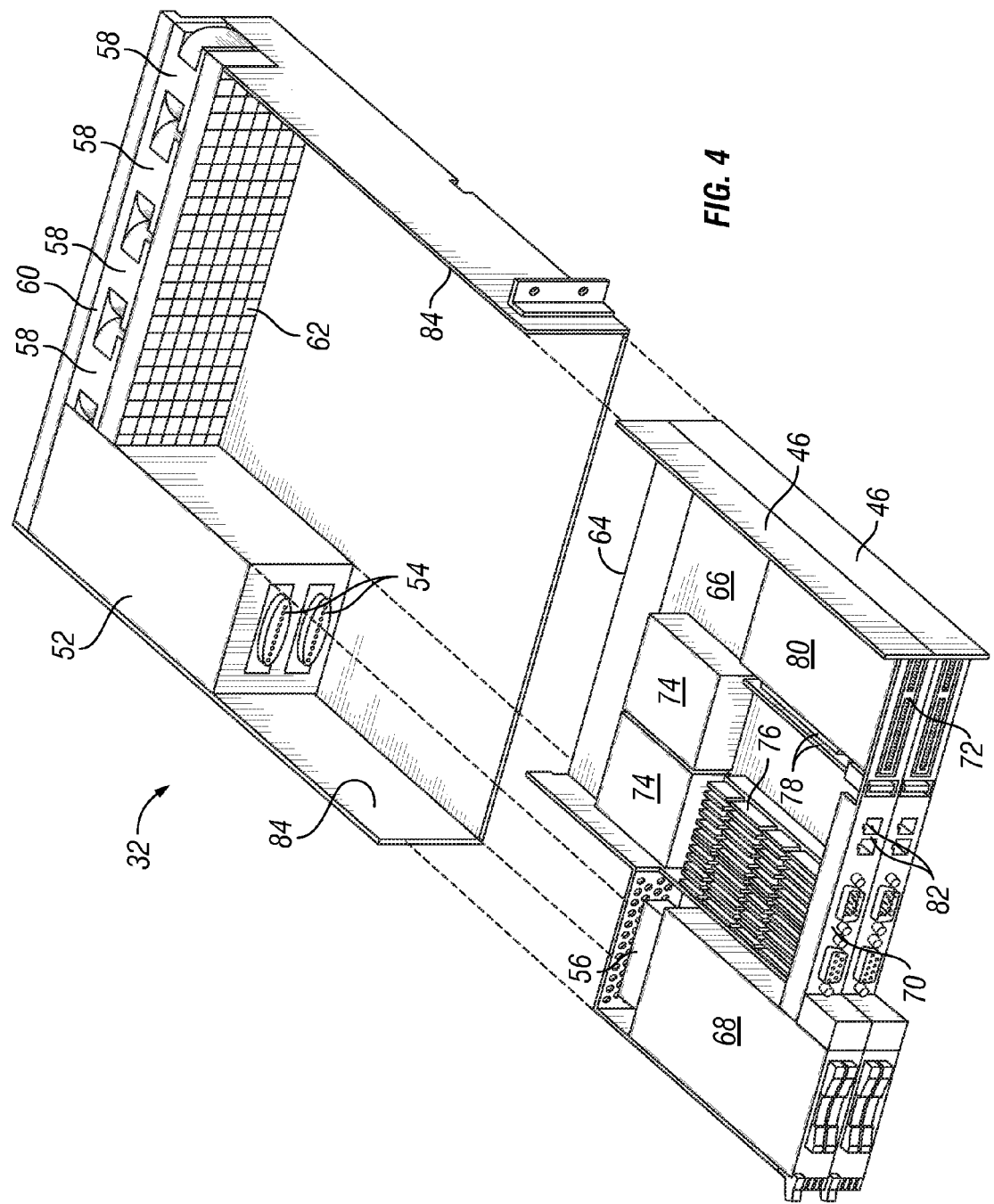
FIG. 4 is a schematic partial assembly view of a chassis receiving a computer subassembly that include two compute modules, wherein the chassis and subassembly have a top cover removed to show the components therein.

FIG. 4 is a schematic partial assembly view of the chassis 32 receiving the two compute modules 46, wherein the chassis and upper compute module each have a top cover removed to show the components therein. The 2U chassis 32 includes a power supply 52 having two front-facing connectors 54 for direct blind docking with mating connectors 56 on the compute modules 46. The 2U chassis 32 also includes a set of four fans 58, preferably secured in a pack or tray 60 having an air intake grill 62. Although the number of fans may vary, the 2U chassis 32 can accommodate larger diameter fans than a 1U module. Accordingly, the chassis 32 provides fewer, but larger fans that provide an air flow that is suitable to cool the module components while making more efficient use of electricity. Optionally, a 3U chassis might have only three or four fans of an even greater diameter.

The two compute modules 46 are preferably independently aligned and inserted into the chassis 32. Optionally, a single compute module may be installed or two compute modules may be installed separately as needed. Each individual compute module 46 includes a tray 64, a rearward facing power connector 56, a motherboard 66, a hard disk drive 68, an input/output panel 70, and a PCI slot 72. The motherboard 66 is preferably an industry standard motherboard, which may include a pair of processors 74, a plurality of memory modules 76, a riser card 78 and a PCI card 80. Other components that are necessary or beneficial to the operation of the motherboard 66 are not shown, but it should be understood that such other components will be present on a functioning motherboard. Furthermore, the input/output panel 70 includes standard network connectors, such as Ethernet connectors 82, which can be used to connect the motherboard 66 to a network switch (not shown) using an Ethernet cable. For purposes of this disclosure it is assumed that each compute module is similarly equipped although the number and types of components may vary.

Upon insertion into the chassis 32, the compute modules 46 are guided rearward along the side walls 84 of the chassis 32 until a rearward facing power connector 56 on each the two compute modules 46 have blind docked with one of the two front-facing connectors 54 on the power supply 52. The vertical spacing of the front-facing connectors 54 and the rearward-facing connector 56 is the same to facilitate their connection. Accordingly, the motherboard 66, hard disk drive 68 and other components of each compute module 46 are supplied with power. Preferably, the fan assembly 60 is directly powered and controlled by the power supply 52 which gets thermal sensor data passed to it from the compute module.

Figure 5:
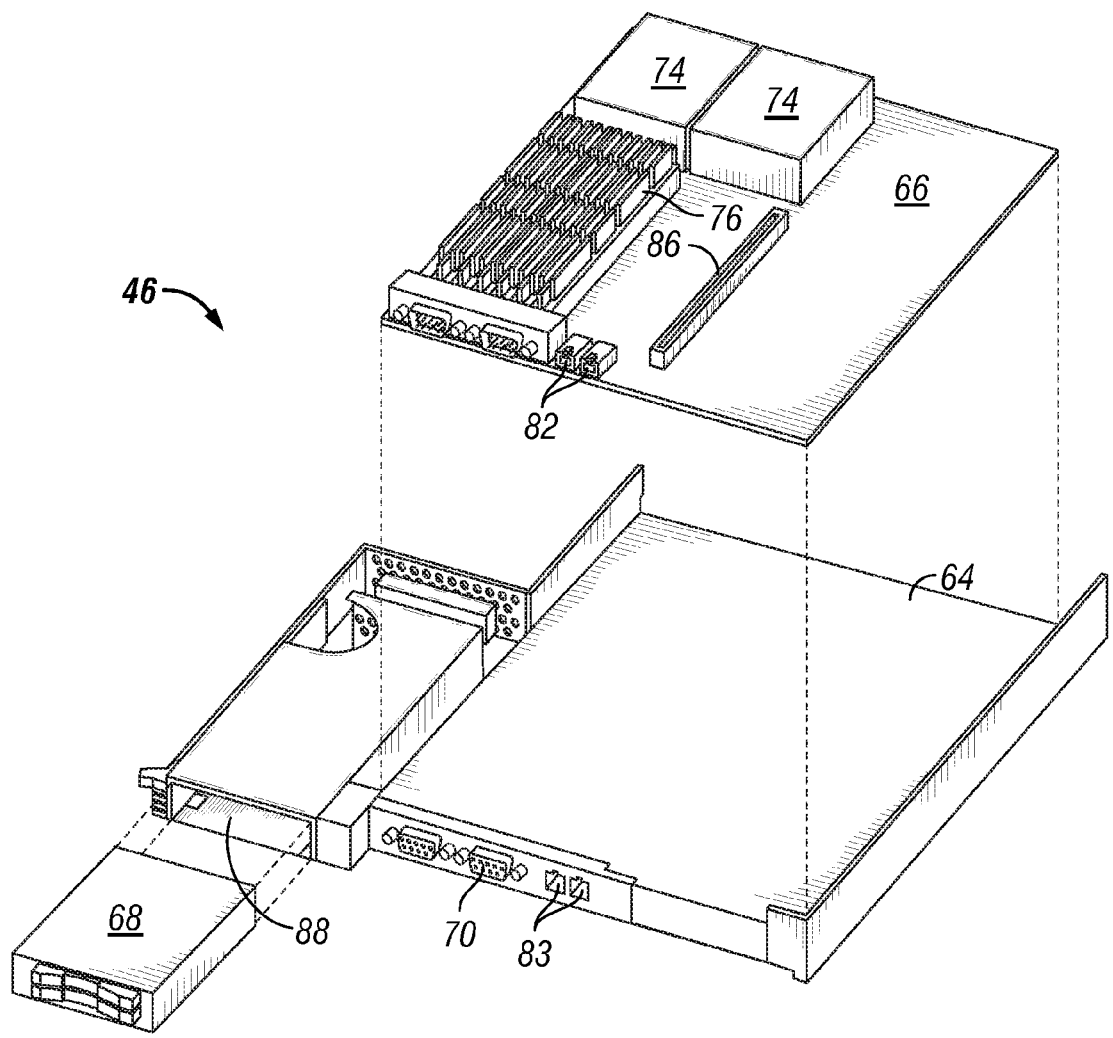
FIG. 5 is a schematic assembly view of a single compute module.

FIG. 5 is a schematic assembly view of a single compute module 46. A standard motherboard 66 is secured into a module tray 64 with the input/output connectors 82 aligned with openings 83 in the input/output panel 70. In FIG. 5, the motherboard is shown with a PCI connector 86 that receives the riser card 78 and PCI card 80 shown in FIG. 4. A hard disk drive 68 is insertable into the disk drive bay 88 formed in the tray 64. Preferably, the disk drive bay 88 includes connectors that facilitate blind docking the hard disk drive 68 into the bay 88 for communication with the motherboard 66. Cable connections from the rearward-facing power connector 56 to the motherboard 66 and the hard disk drive bay 88 must also be provided before the compute module 46 is ready for use.

Figure 6:
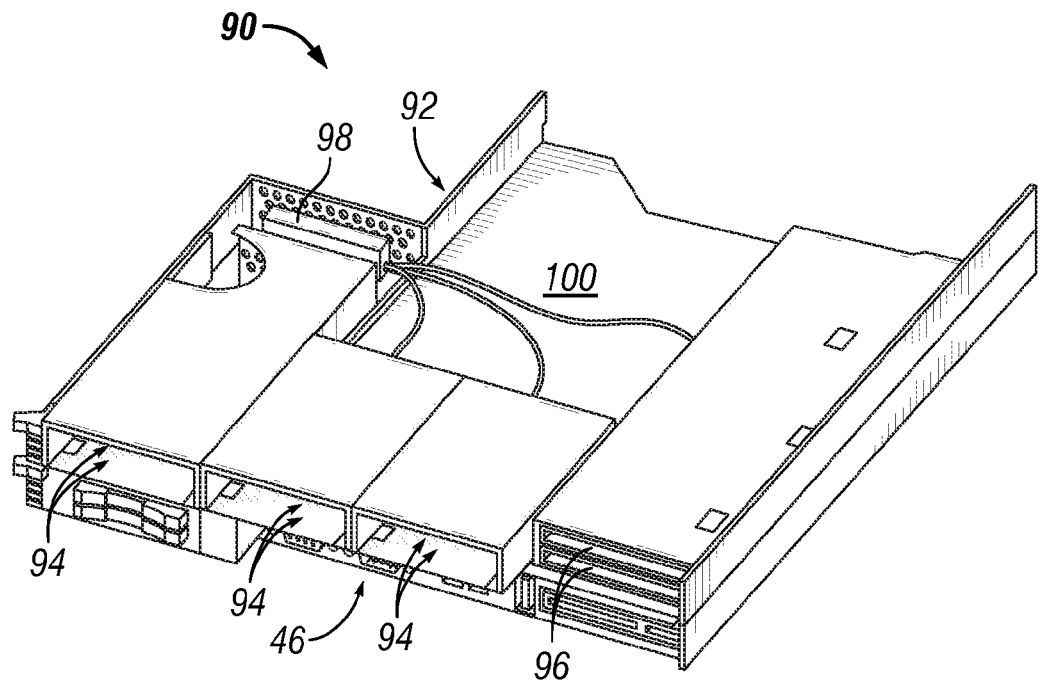
FIG. 6 is a perspective view of a 2U computer subassembly including a single compute module and a first expansion module secured to the compute module, wherein the first expansion module accommodates hard disk drives and PCI slots.

FIG. 6 is a perspective view of a 2U computer subassembly 90 including a single compute module 46 and a first expansion module 92 secured above the compute module, wherein the first expansion module 92 provides six small form factor hard disk drive bays 94 and two PCI slots 96. This expansion module 92 can alternately provide one 3.5 inch hard disk bay and two PCI slots 96. A rearward-facing power connector 98 is disposed on the expansion module tray 100 to directly blind dock with a power supply connector 54 (See FIG. 4) and provide power to each of the hard disk drive bays 94. One or more openings in the expansion module tray 100 allow one or more communication cable to extend between components installed in the expansion module 90 and the motherboard 66 in the compute module 46 that lies beneath the expansion module. Accordingly, it is preferably, but not absolutely necessarily, for the compute module and expansion module to be mechanically coupled to aid in their coordinated insertion into a chassis. Such mechanical coupling may include the use of any conventional fastener or fastening system, but is preferably simple and quick to couple and uncouple. For example, the mechanical coupling may be a simple set of tabs or hinge pins on one module that is aligned to be received in a slot in an adjacent module so that two modules will not slide relative to one another, but may be easily separated outside a chassis by lifting or rotating one module relative to the other. (See also FIG. 9) Both the expansion module 90 and the compute module 46 in FIG. 6 may then be installed in the same 2U chassis, such as the chassis 32 of FIG. 4.

Figure 7:
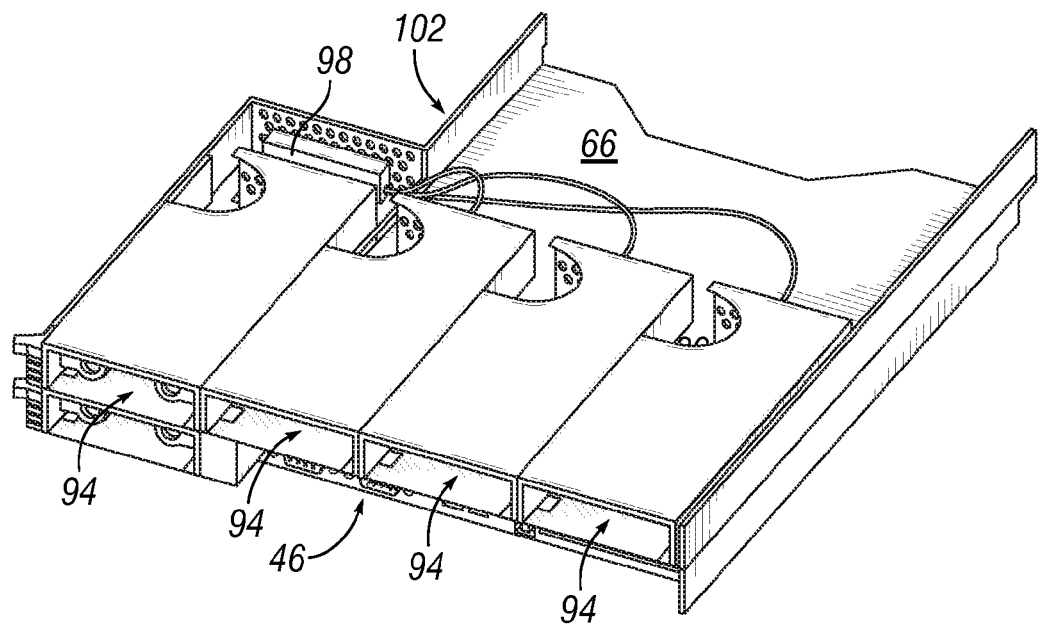
FIG. 7 is a perspective view of a 2U computer subassembly including a single compute module and a second expansion module secured to the compute module, wherein the second expansion module accommodates only hard disk drives.

FIG. 7 is a perspective view of a 2U computer subassembly including a single compute module 46 and a second expansion module 102 secured to the compute module and having 3.5 inch hard disk drive bays 94 and no PCI slots. The differences between expansion module 90 of FIG. 6 and the expansion module 102 of FIG. 7 are shown to illustrate the flexible configuration enabled by the system.

Figure 8:
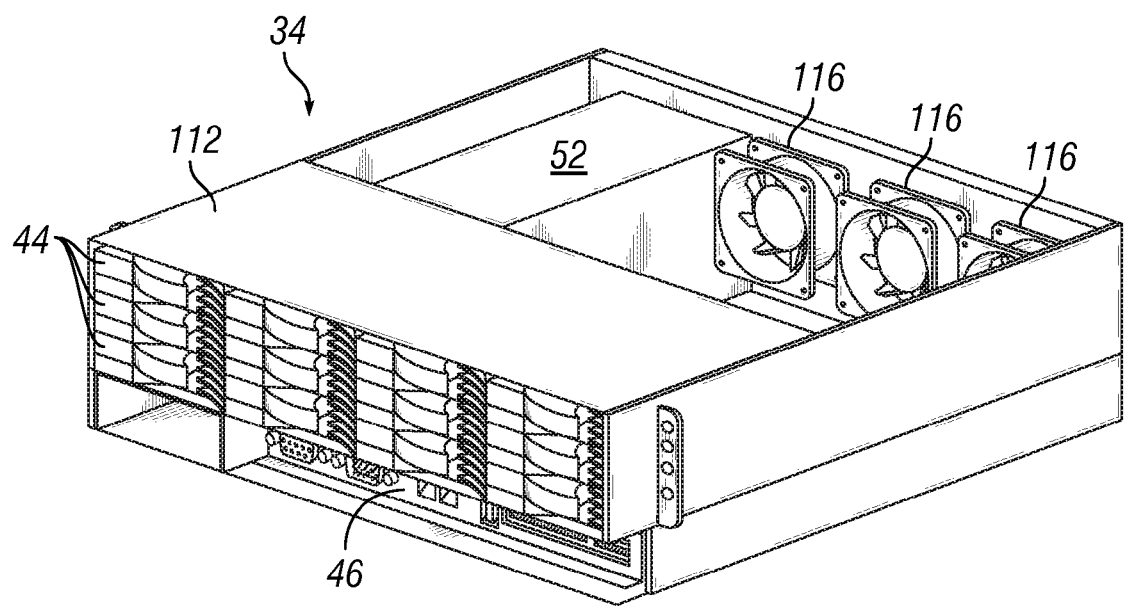
FIG. 8 is a perspective view of a 3U computer chassis that accommodates twelve hard disk drives and a single compute module.

FIG. 8 is a perspective view of the 3U chassis 34 (top panel removed for clarity) that includes twelve 3.5 inch drive bays that accommodate disk drives 44 and includes a module bay that has received a single compute module 46. The 3U chassis 34 is shown having four fans 116 and a power supply 52. Although the four fans are larger than in the 2U chassis of FIG. 4, there is otherwise little difference between the two chassis. In fact, the twelve hard disk drives 44 may be wired to receive power from the upper of the two power supply connectors 54 and to communicate with the motherboard in compute module 46 as previously described. Accordingly, the chassis 34 may be installed in a 3U chassis bay 38 formed in the rack 10 as shown in FIG. 1.

Figure 9:
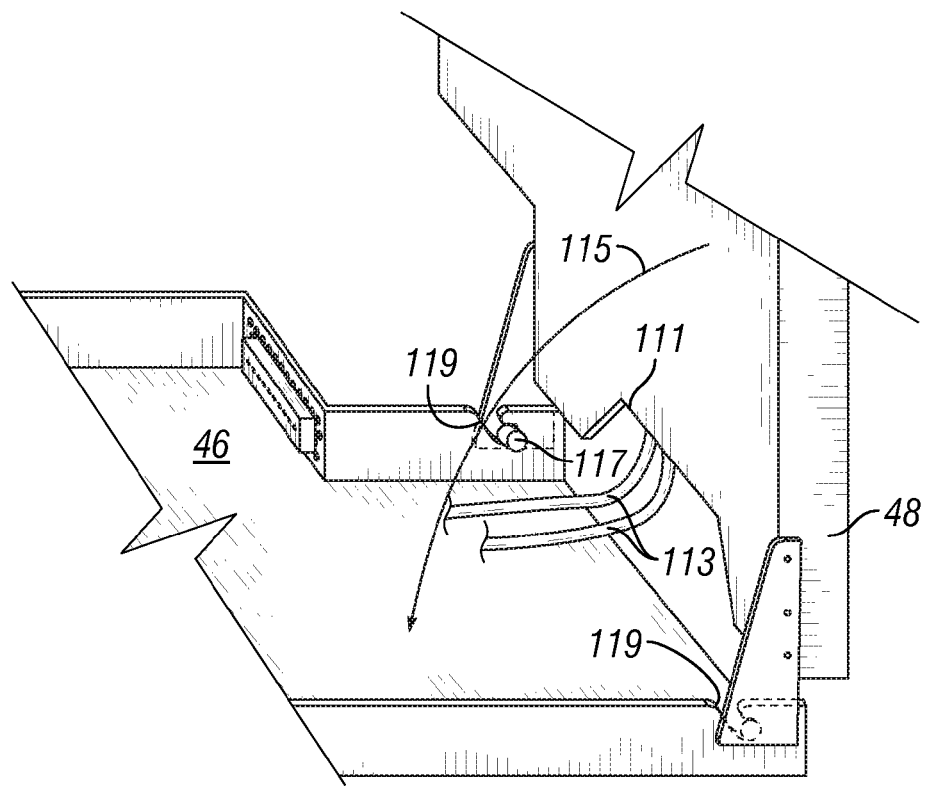
FIG. 9 is a schematic side view of two modules being secured together for use within a chassis.

FIG. 9 is a schematic side view of a compute module 46 and an expansion module 48 being secured together for use within a chassis. Each compute module 46 has two curved slots 119 located on the rear portion of its sides that receives hinge pins 117 attached to the rear side portions of the expansion module 48. Accordingly, the two modules 46, 48 may be coupled together by positioning the expansion module 48 at an angle above the compute module 46, inserting the hinge pins 117 on the expansion module into the curved slots 119 in the compute module, then rotating the expansion module 48 downward onto the compute module 46 (in the direction of arrow 115). The bottom panel of the expansion module 48 preferably forms the top cover of the compute module 46. Furthermore, cables 113 are shown coming from the compute module 46 back to the leading edge of the expansion module 48 near the hinge pins 117 where the cables wrap around the open ends of the modules and are routed to the appropriate electrical connection on the expansion module. This allows the cable to flex as the expansion module is rotated relative to the compute module. The expansion module 48 includes an optional cut out portion 111 that allows the cables to extend between modules without extending beyond the leading edge of the modules.

Figure 10:
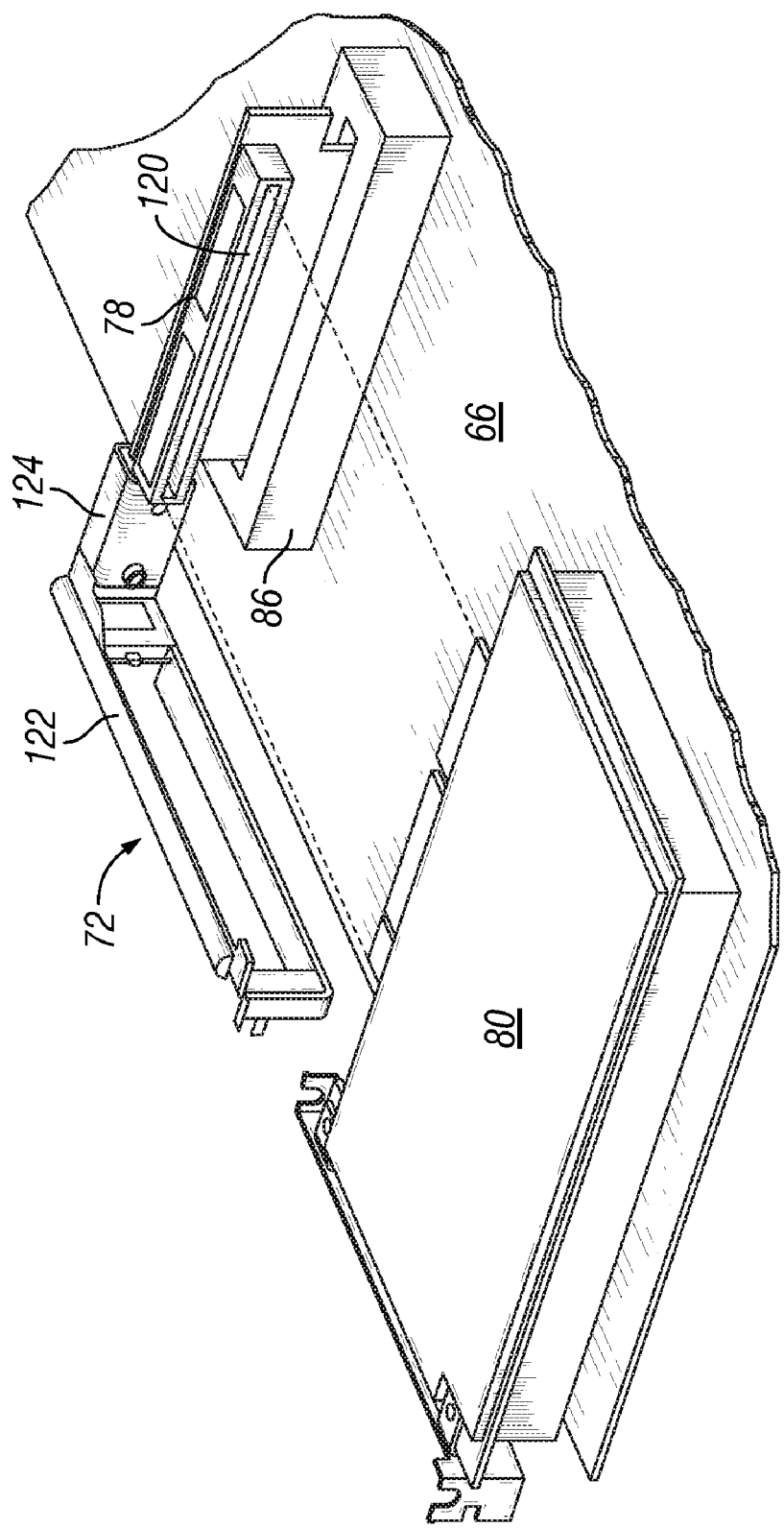
FIG. 10 is a perspective view of a riser card that allows the use of a PCI card in a close parallel relationship to the motherboard.

FIG. 10 is a perspective view of a riser card 78 that allows the use of a PCI card 80 in a close parallel relationship to the motherboard 66. The riser card 78 is connected to the PCI connector 86 on the motherboard 66 and provides a similar connector 120 with a connector slot formed at a right angle to the riser card 78. Accordingly, the PCI card 80 may be inserted into the connector 120 and operate as if it were connected directly into the connector 86. An advantage of the riser card 78 is that it allows the installation of the PCI card 80 in a position substantially parallel to the motherboard 66 and keeps the resulting module thin. As shown in this assembly, the riser card 78 is supported by a frame 122 and arm 124. The frame 122 may be secured to a wall of the tray 64 (See FIG. 4) and also help support the PCI card 80, preferably using a standard attachment mechanism.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for receiving and supporting a plurality of modules, comprising:
    a rack having a front side providing access to a plurality of chassis bays, each chassis bay being adapted to receive a chassis and align a back end of the chassis for blind docking with an electrical power source;
    a chassis received in a chassis bay and blind docked to an electrical power source, the chassis including a power supply, a fan, and a front side providing access to a plurality of module bays, each module bay configured to receive a module and align a back end of the module for blind docking with the power supply;
    a compute module received in a module bay and directly blind docked to the power supply, the compute module including a motherboard in communication with an input/output panel on a front side of the module; and
    at least one other module received in a module bay within the same chassis as the compute module and directly blind docked with the same power supply along with the compute module, wherein the at least one other module is interchangeably selected from the group consisting of a second compute module and an expansion module, wherein the expansion module includes one or more components selected from the group consisting of a hard disk drive, PCI card, or combinations thereof, and wherein the one or more components of the expansion module are controlled by the motherboard of the computer module within the same chassis.

2. The system of claim 1, wherein the rack forms two columns of chassis bays.

3. The system of claim 1, wherein the chassis includes two module bays.

4. The system of claim 1, wherein the chassis includes twelve 3.5 inch disk drive bays and one compute module bay.

5. The system of claim 1, further comprising:
a plurality of chassis, each chassis received in a chassis bay of the rack, wherein the plurality of chassis includes at least one chassis with two module bays and at least one chassis with three module bays.

6. The system of claim 1, further comprising:
a plurality of chassis, each chassis received in a chassis bay of the rack, wherein the plurality of chassis includes at least one chassis including two compute modules and at least one chassis including a compute module and an expansion module.

7. The system of claim 6, wherein the compute module includes a disk drive bay.

8. The system of claim 1, wherein the at least one other module is an expansion module.

9. The system of claim 1, further comprising:
a plurality of chassis, each chassis including at least one compute module; and
a network switch disposed in the rack and having an input/output panel accessible from the front of the rack; and
wherein each compute module communicates with the network switch via a cable having both ends fully accessible from the front of the rack without disturbing the position of any other component of the system.

10. The system of claim 9, wherein the network switch extends perpendicular to each compute module and is disposed along the side of each compute module.

11. The system of claim 10, wherein each cable extends between the input/output panel of a compute module and the input/output panel of the switch without blocking the front of adjacent compute modules.

12. The system of claim 1, wherein the rack has a back side opposite the front side, wherein the back side provides an air opening that is covered by a heat exchanger.

13. The system of claim 12, wherein an operational position of the heat exchanger blocks access to the plurality of modules from the back side of the rack.

14. The system of claim 13, wherein the heat exchanger is hinged to the rack for movement between the operational position and a second position for access into the rack from the back side of the rack.

15. The system of claim 12, wherein the fans direct air flow into the front side of the rack and out the back side of the rack through the heat exchanger.

16. The system of claim 12, wherein the heat exchanger includes tubes for circulating a cooling fluid.

17. The system of claim 16, wherein the heat exchanger is a fin tube heat exchanger.

18. The system of claim 1, wherein the input/output panel of each compute module provides the only communication pathway between that compute module and any other compute module in a different chassis.

19. The system of claim 1, wherein each compute module is a basic server.

20. The system of claim 1, wherein the fans are powered and controlled by the power supply in the same chassis.

* * * * *